United States Patent [19]

Dorey, II et al.

[11] Patent Number: 4,537,799

[45] Date of Patent: Aug. 27, 1985

[54] SELECTIVE METALLIZATION PROCESS

[75] Inventors: John K. Dorey, II, Ewing Township, Mercer County; Steven L. Schmidt, Trenton; Wesley P. Townsend, Princeton Township, Mercer County, all of N.J.

[73] Assignee: AT&T Technologies, Inc., New York, N.Y.

[21] Appl. No.: 600,712

[22] Filed: Apr. 16, 1984

[51] Int. Cl.$^3$ .................... B05D 5/12; B05D 1/32; B05D 3/10
[52] U.S. Cl. .................... 427/259; 427/98; 427/306; 427/307
[58] Field of Search .............. 427/98, 304, 259, 305, 427/306, 307

[56] References Cited

U.S. PATENT DOCUMENTS

| | | | |
|---|---|---|---|
| 3,562,038 | 2/1971 | Shipley, Jr. et al. | 427/98 X |
| 3,929,483 | 12/1975 | Wainer et al. | 96/38.4 |
| 4,151,313 | 4/1979 | Wajima et al. | 427/98 |
| 4,224,118 | 9/1980 | Hans | 204/15 |
| 4,268,349 | 5/1981 | Hacke et al. | 156/656 |
| 4,270,985 | 6/1981 | Lipson et al. | 204/15 |
| 4,297,175 | 10/1981 | Schlegel et al. | 204/15 |
| 4,388,351 | 6/1983 | Sawyer | 427/304 |

*Primary Examiner*—Evan K. Lawrence
*Attorney, Agent, or Firm*—J. F. Spivak

[57] ABSTRACT

A selective metallization process particularly suited for making printed circuit boards comprises the step of treating a substrate having a negative mask thereon with a reactant, e.g., acetic acid, which modifies the surface of the mask without affecting the substrate so as to remove or prevent an active catalytic layer from remaining on the surface of the mask thereby preventing electroless plating on the mask.

15 Claims, No Drawings

4,537,799

SELECTIVE METALLIZATION PROCESS

TECHNICAL FIELD

This invention relates to a method for forming a metal pattern on the surface of a substrate. More particularly, the present invention relates to a method for forming a metal pattern on an insulating substrate particularly suitable for the manufacture of high resolution printed circuit boards.

BACKGROUND OF THE INVENTION

It is well known to apply an electroless metal plating to an insulating substrate, such as plastic, by depositing a noble metal such as palladium, gold or platinum as an initiator or catalyst on the surface of the insulating substrate and then dipping the substrate into an electroless metal plating solution. It is also known to catalyze a surface with a non-noble metal catalytic layer, e.g., Cu, by reduction of a copper compound adsorbed on the surface.

Various techniques have been proposed to form an electric circuit by electroless metal plating on flexible or rigid substrates for the manufacture of printed circuits. Among the methods utilized to form the printed circuit boards is the method disclosed in U.S. Pat. No. 3,929,483 wherein a photoresist is laid on a surface which is highly absorbent to silver salts. Such a surface is anodized aluminum. Photoresist deposited on the surface is then exposed to light through a negative to attain a desired circuit pattern. The portions not struck by light are removed by washing in a suitable solvent. Thereafter, the substrate is soaked in a concentrated solution of silver nitrate wherein the silver salt is held by the adsorptive surface not coated by the resist. This silver salt is then reduced to metallic silver by treatment with a suitable reducing agent. The photoresist is then removed by treatment with an appropriate solvent leaving the desired silver image on the adsorptive media. The silver metal deposit acts as a catalyst for subsequent electroless plating.

In another electroless deposition method for the formation of a printed circuit board, the substrate is first sensitized and activated to form a blanket catalyzed layer thereon. Thereafter the resist pattern is formed over the catalyed layer and the substrate is then treated with an electroless metal deposition solution. In this way, metal deposits only on the sensitized, activated, exposed substrate area and not on the resist covered areas. However, in this method the resist must be removed and the catalytic layer underlying the resist must then be etched away to prevent an excessively low surface resistivity due to the catalytic layer on the surface.

In the first of the above-mentioned methods the method is limited to the use of silver salts and a substrate which has preferential adsorption of the silver salt and in the second method, the resist must be removed and an etching step must be employed to remove catalyst underlying the resist. In both methods, however, one may build up the metal deposit while the resist is on the substrate such that the resist provides a channel to prevent widening of the circuit lines to be formed by the depositing metal.

In contrast, U.S. Pat. No. 4,388,351 describes a method for forming a printed circuit board by first providing a negative resist pattern over the surface of the substrate, etching the surface, sensitizing and catalyzing the surface, providing a thin porous flash electroless deposit over the catalyzed substrate, stripping the negative mask together with the catalytic layer and flash coating which overlies the negative mask, thereby leaving a positive flash coated circuit pattern on the substrate and thence electrolessly plating copper to the fullest desired thickness. This method, while advantageous for several reasons and solving some problems in the art has disadvantages of its own. More particularly, one must be extremely careful of the amount of the flash plating deposited in that if it is too thin it does not act in its intended purpose of making a more robust image which allows for greater inventory time before final full build plating. Alternatively, if it is too thick, stripping of the negative mask is difficult. Further, since the negative mask is removed prior to full build electroless plate, the electroless plating not only causes the image to grow in thickness, as desired, but also the image will grow in width as well, thereby preventing or making it extremely difficult to control the desired line width especially when one is dealing with fine line high density printed circuits.

It would therefore be desirable to provide an inexpensive method which is compatible with normal processing such as indicated above. It is also desirable that the photoresist used to define the circuit pattern can remain intact during the full build plating, thereby providing a channel of a defined width preventing spreading as one plated to the desired thickness. Further it is often desirable to eliminate the necessity of stripping the resist and etching away any underlying catalyst.

SUMMARY OF THE INVENTION

A selective metallization process comprises the steps of providing a patterned negative mask layer on a substrate, treating the patterned substrate so as to provide a catalytic layer thereon and electrolessly plating the catalyzed substrate with the patterned mask still intact thereon, including the step of treating the patterned substrate with a reactant which modifies the surface of the mask without substantial attack on the exposed substrate either before, after, or both before and after catalyzation and prior to electroless plating to prevent electroless deposition on the mask.

The electroless plating step can be done in a single direct full build electroless plate or can be done, as in U.S. Pat. No. 4,388,351 wherein a flash plate is first employed followed at any time thereafter by a full build electroless plate. In this latter instance, the thickness of the flash plate is not critical due to the treatment of the patterned substrate with the reactant prior to catalyzation which causes the catalyst not to be retained on the surface of the mask or otherwise inhibits catalyzation. Hence, the flash plate or direct full build electroless plating does not occur on the surface of the mask and the mask does not have to be removed.

DETAILED DESCRIPTION

The process of the invention can be employed for many applications where a patterned metal layer is to be applied to an insulating substrate, but will be illustrated in detail with reference to the manufacturer of a printed wiring board. Such printed wiring boards may be of the rigid or flexible type. Furthermore, the present invention will be discussed primarily in terms of selectively depositing copper on a surface of an insulating substrate. It will also be readily appreciated that the inventive concept is equally applicable to depositing other suitable metals.

In accordance with the present invention, a negative mask is applied to a surface of a suitable substrate. Typically, the mask is of the photoresist type whereby portions of the substrate surface are exposed in a positive circuit pattern while the remaining portion of the substrate is covered by the photoresist mask. Thereafter, it is generally preferred (but not necessary) to treat the substrate so as to create a rooting structure by forming micropores therein. This results in increased adhesion of the catalytic layer and copper layer to be subsequently provided on the substrate. While such micropores are predominantly formed in the exposed portions of the substrate, in practice, we have found that there is also some attack of the surface of the negative mask. This attack of the surface of the mask, if left untreated in accordance with the teachings herein, would result in the subsequently applied catalytic species readily depositing on the mask as well as the exposed areas of the substrate. This is undesirable since this would promote electroless plating on the mask as well as the exposed substrate. We have discovered that by treating the substrate with a reactant which causes some attack or modification of the surface of the mask, e.g., mild dissolution or smoothing of the surface without substantially attacking the substrate, the adhesion on the surface of the mask to catalyst can be essentially eliminated such that subsequent catalyzation does not result in an active catalytic layer forming on the surface of the mask. There are a number of possible explantions for this, including smoothing the surface and altering the chemical species on the surface to provide a species, e.g., chromium ions (present as a result of etching in an acid chromium bath) so as to result in preventing the deposit of an active catalyst. Typically, suitable reactants to achieve this end, particularly where an epoxy or rubber-modified epoxy substrate is employed with almost any commerically available photoresist type mask are solutions of acetic acid, formic acid or propionate acid or mixtures thereof. Subsequent to such acid treatment, the substrate is then treated so as to sensitize the exposed surfaces of the substrate to form thereon a catalytic species capable of catalyzing an electroless metal deposition without forming such an active catalytic species on the surface of the photoresist mask.

Alternatively, treatment of the substrate having the mask thereon with the reactant may be done subsequent to catalyzation but prior to electroless deposition. In this case, the catalytic layer is washed away by the reactant as it dissolves a small amount of mask material from the surface of the mask underlying the catalytic layer (which is generally a porous layer) and/or the catalytic layer is otherwise deactivated. In either procedure, since only a small amount of the mask is modified and/or dissolved by the reactant, the mask dimensions remain relatively unchanged. Of course, one can also treat the substrate having the mask thereon with the reactant both before and after catalyzation; however, this is not necessary. With the mask in place, the catalyzed substrate is then treated with an electroless plating solution. Alternatively, one may first apply a thin electroless flash plated layer and at any time thereafter provide a full build electroless or electroplate or one may directly form a full build electroless metal deposit on the substrate surface. In either of these two methods, the thickness of the metal is built-up while the width is confined within the channel defined by the negative mask which remains on the substrate. Consequently, an extremely well defined fine line pattern can be formed. In addition, as compared to the prior method wherein the thickness of a flash plate is critical, here the thickness of the flash plate is not critical and the manufacturing operating window is therefore much easier to achieve.

Subsequent to the deposition of the full build metal deposit, one may optionally remove or leave on the negative mask during further processing. It has been unexpectedly discovered, that commercial photoresist type masks can even be left on during the soldering process without detrimental effect. Also there is no catalytic layer underlying the mask in accordance with this method.

In the practice of the invention a suitable substrate is first selected. Typical suitable substrates include bodies comprising inorganic and organic substances such as glass, ceramics, porcelain, resins, paper, cloth and the like.

For printed circuits, among the materials which may be used are insulating thermosetting resins, thermoplastic resins and mixtures of the foregoing, including fiber, e.g., fiberglass, impregnated embodiments of the foregoing.

Included in the thermoplastic resins are acetyl resins; acrylics, such as methacrylate; cellulosic resins, such as ethyl cellulose, cellulose acetate, cellulose propionate, cellulose acetate butyrate, cellulose nitrate, and the like; polyethers; nylon; polyethylene; polystyrene; styrene blends, such as acrylonitrile-styrene copolymers and acrylonitrile-butadiene styrene copolymers; polycarbonates; polychlorotrifluoroethylene; and vinyl polymers and copolymers, such as vinyl acetate, vinyl alcohol, vinyl butyral, vinyl chloride, vinyl chloride acetate copolymer, vinylidene chloride and vinyl formal.

Among the thermosetting resins may be mentioned allyl phthalate, furane, melamine formaldehyde, phenol formaldehyde, and phenol furfural copolymers, alone or compounded with butadiene acrylonitrile copolymers or acrylonitrile-butadiene styrene copolymers, polyacrylic esters, silicones, urea formaldehyde, epoxy resins, allyl resins, glycerol phthalates, polyesters, and the like.

The substrates may also comprise porous materials and fibers which have been impregnated with resins. The invention is particularly applicable to metallization or resin-impregnated fiber structures of the type described. A preferred substrate has been found to be a glass reinforced epoxy substrate commercially available as NEMA grade FR-4 available from NVF Corporation, EG-873-2101; Snythane Taylor FB-G20 and Norplex G10-FRA. Polyimide type substrates are also suitable.

After a suitable substrate is selected the substrate is generally drilled to form desired through holes and then, if needed, cleaned by known cleaning or scrubbing techniques in preparation for further processing.

A negative resist pattern is then formed over a surface of the substrate so as to delineate the desired circuit pattern in the areas not coated by the resist. The term resist, as used herein, includes any layer which can be applied to the surface of the substrate to form the desired negative pattern over which a catalytic layer can be formed, which layer can later be removed by a solvent. Suitable resist include photoresists, inks and the like which are well known in the electroless plating and printed wiring board arts and are commercially available. The resists layer can be applied by any of the known techniques such as dip coating, spray coating, printing, laminating and the like. The resist pattern may be formed directly by well known printing techniques such as screen printing or by well known photoresist light exposure and development techniques. It is generally preferred for high resolution printed wiring boards, to form the pattern using a photoresist which is applied to the substrate surface, exposed through a mask to form an image of the desired pattern and then developed.

Depending upon the substrate surface, it is generally desirable to form micropores in the surface such as by etching or swell-etching the surface. Swell-etching is generally achieved by first swelling the surface with a suitable solvent and then etching with a suitable etchant such as chromic acid or chromic acid sulfuric acid based solutions in order to increase adhesion of the catalytic layer and electroless layer to be formed over the surface of the substrate and resist.

Subsequent to the etchant step the substrate is preferably rinsed in deionized water and treated with a neutralizing solution such as a caustic solution of sodium hydroxide so as to neutralize the acid which may remain. A rinsing step subsequent to neutralization is also preferred. It is believed that during this procedure some chromium becomes entrapped in the resist layer.

In accordance with the present invention, the surface is then treated with a reactant which causes dissolution of or otherwise modifies the surface of the resist layer without substantial attack of the substrate. It is important to note that it is not complete dissolution or modification of the entire resist layer but rather a mild attack of the surface of the resist layer which results in a reflowing, resmoothing or modification of the surface of that layer. This may be accomplished by treatment, for example, with a solution of a week acid such as acetic, formic or propionic acid. Where chromium ions were present in the resist layer it is hypothesized that these ions are exposed at the surface and chemically initiate a reaction which inhibits the adhesion of an active catalyst or masks the deposited catalyst. It may be noted that if one provided a dry film resist having such chromium ions present near the surface of the resist, it is believed that the same inhibition of active catalyzation would occur. Similarly, other species known to poison catalysts could act in the same way. Subsequent to this treatment the surface is then sensitized so as to form a catalytic layer thereon.

Essentially any of the well known and commercially available sensitizing solutions may be employed. Sensitization can be carried out for example by means of tin-palladium sensitizing solutions to form a palladium catalytic layer or by means of sensitization with a non-noble metal such as by the use of copper compounds such as cuprous oxide or copper formate which is then reduced by means of a reducing agent to form a catalytic copper metal layer. As aforesaid, sensitization of surfaces to form catalytic layers is well known in the art and therefore need not be discussed at length herein.

Generally, after sensitization, the substrate surface is rinsed and, depending upon the sensitizer used, it may be desirable to employ an accelerator or stabilizer solution to stabilize the catalytic layer. Such accelerators or stabilizers are also well known in the art. For example, suitable accelerators for Sn-Pd sensitizers are Metex 9071 sold by MacDermid Corporation, Accelerator 19 sold by Shipley or an alkaline solution. Also, one may further inhibit the catalyzed substrate by rinsing in hydrochloric acid.

After catalyzation the substrate is then treated in an electroless metal plating bath so as to form an electroless metal deposit over the catalytic layer. Typically, such a deposit is about 1.3 to 1.4 mils thick. If desired, plating thickness may be built-up by electroplating. Also, if desired portions of the circuits may be plated with other metals such as gold, to enhance solderability or bondability of components thereon, the full thick metal deposit may be provided directly in one step with a direct full build electroless plating bath such as MacDermid 9620 or Photocircuits CC4 or other commercially available copper electroless plating baths of the copper sulfate-formaldehyde-sodium hydroxide chelating agent type. Alternatively, one may first form a flash plate by treating the catalyzed layer with MacDermid flash electroless copper plating bath 9085 or 9072 or 9073 to form a thin electroless copper deposit which thereafter is subsequently treated with either an electroless plating bath as aforesaid or an electroplating bath to provide full thickness of the copper layer. It should be noted that the aforementioned hydrochloric acid rinse subsequent to catalyzation and prior to electroless plating is a preferred embodiment as it helps to insure that no platng occurs on the surface of the resist mask.

EXAMPLE I

An epoxy coated FR-4 epoxy-glass type substrate having a resist pattern comprising Dynachem LD-15 solvent strippable resists thereon was treated as follows: the substrate was immersed in a dimethylformamide swellant, the swellant was drained from the substrate and the substrate was then immersed for about five minutes in a chrome-sulfuric acid etch solution at 55° C. The etch solution contained about 100 grams per liter chromic acid in 11 normal sulfuric acid. The etch substrate was then rinsed in deionized water. These steps provide a rooting structure (micropores) for the promotion of copper adhesion. To insure removal of the acid, the substrate is then immersed in a warm 1-2 normal sodium hydroxide bath and then rinsed. Thereafter the substrate is treated for about two minutes in a five volume percent acetic acid solution at about 50° C. This solution is formed by mixing glacial acetic acid with water. Thereafter the substrate is rinsed and immersed in a 30 volume percent hydrochloric acid solution. The substrate is then catalyzed by treating with a commercial catalyst, e.g., MacDermid 9070 Sn/Pd catalyst for about four minutes. The substrate is then rinsed, immersed in a one normal sodium hydroxide accelerator solution, rinsed again and then plated with a flash copper plate solution by immersion in a MacDermid 9085 electroless plating bath for approximately three minutes. The substrate was rinsed and stored until it was put through a MacDermid 9620 full build electroless copper bath with a resist still intact so as to provide a 1.4 mil vinyl copper thickness. Results showed minimal extraneous copper on the resist surfaces which copper was easily removed either in a resist tripping step, e.g., methylene chloride treatment or by scrubbing. Peel strengths of the plated copper wherein the 10-13 pound per inch range.

EXAMPLE II

The following procedure was used on both epoxy coated FR-4 substrates and rubber-modified epoxy powder coated FR-4 substrates employing both Dupont 1215 and Dynachem CR type commercial resist. In all cases a six mil line/ten mil spaced comb pattern was provided on the substrate. Slight modifications in the processing steps were made as between the epoxy coated substrates as opposed to the rubber-modified epoxy powder coated substrates. The procedure employed for the epoxy coated substrates is as follows: the substrate with the resist pattern thereon was swelled at 30° C. in 86 volume percent dimethylformamide for about 15 seconds and then drained. It was then treated for about five minutes in a chrome-sulfuric acid etch solution as set forth in Example I and thereafter rinsed and neutralized in a 2-3 normal sodium hydroxide solution at 50° C. The substrate was then rinsed and treated for two minutes with a 20 volume percent glacial acetic acid solution at 55° C., rinsed again and treated for one-half minute for 30 volume percent hydrochloric acid. Thereafter the substrate was catalyzed with MacDermid 9070 catalyst, rinsed, treated again with 30 volume percent hydrochloric solution and then treated with two normal sodium hydroxide as a neutralizer-accelerator prior to immersion in MacDermid 9085 electroless flash copper bath. After another rinsing, the substrate was then treated with MacDermid 9620 full build electroless copper until a thickness of 1.4 mils was acheived. In the case of the rubber-modified epoxy powder coated substrates, the swellant employed was a 67 volume percent solution of dimethylformamide at 40° C. for four and one-half minutes and the etchant was a 140 gram per liter solution of chromic acid in 10.5 normal sulfuric acid. Also the HCl treatment prior to catalyzation was increased from thirty seconds to two to three minutes. In both instances, good reproducibility of the six mil line/ten mil spaced comb pattern was acheived. In all evaluations the peel values of the copper were all greater than ten pounds per inch whenever tested.

It should be noted that the particular concentrations of materials, times and temperatures which are employed are dependent upon the particular substrate and resist that is used and should be optimized depending thereon. Such optimization is well within the skill of those in the art. It should also be noted that other weak acids such as formic and propionate acids may be substituted for the acetic acid in the steps as indicated in the above examples.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A selective metallization process comprising the steps of providing a patterned mask on a substrate, treating the patterned substrate so as to provide a catalytic layer thereon and electrolessly plating the catalyzed substrate with the patterned mask thereon, including the step of treating the patterned substrate with a weak acid reactant which modifies the surface of the mask without substantial attack or modification of the exposed substrate before catalyzation and prior to electroless plating so as to prevent electroless plating on the mask.

2. The method recited in claim 1, wherein the step of electroless plating comprises plating to the full desired thickness in one step.

3. The method recited in claim 1, wherein the electroless plating is a thin flash electroless deposit and wherein the full desired thickness is achieved by a second plating step, said plating step being either electroplating or electroless plating.

4. The method recited in claim 1, wherein the substrate surface comprises an epoxy resin and including the step of swelling and etching said substrate prior to treatment with said reactant.

5. A selective metallization process comprising the steps of providing a patterned mask on a substrate, treating the patterned substrate so as to provide a catalytic layer thereon and electrolessly plating the catalyzed substrate with the patterned mask thereon, including the step of treating the patterned substrate with a weak acid reactant which modifies the surface of the mask without substantial attack or modification of the exposed substrate before and/or after catalyzation and prior to electroless plating so as to prevent electroless plating on the mask, said weak acid comprising an aqueous solution of a member of the group consisting of acetic acid, formic acid and propionic acid.

6. The method recited in claim 5, wherein the reactant is an aqueous solution of acetic acid.

7. The method recited in claim 5 wherein the substrate surface comprises an epoxy resin and including the step of swelling and etching said substrate with an etchant comprising chromic acid.

8. The method recited in claim 7, wherein the acid is acetic acid.

9. The method recited in claim 7, including the steps of neutralizing the chromic acid with a caustic solution subsequent to etching and prior to treatment with said reactant and further treating the substrate with a hydrochloric acid accelerator subsequent to catalyzation.

10. A selective metallization process comprising providing a patterned negative mask on at least one surface of a substrate, said surface comprising an epoxy resin, treating the patterned substrate so as to create micropores on the exposed substrate, treating the patterned substrate with a weak acid reactant which modifies the surface of the mask without attacking the substrate surface, so as to prevent electroless plating on the mask then catalyzing the patterned substrate and electrolessly plating the catalyzed substrate with the mask still intact thereon such that said plating occurs on the exposed substrate but not on the mask.

11. The process recited in claim 10, wherein the weak acid is at least one member of the group consisting of acetic acid, formic acid and propionic acid.

12. The process recited in claim 10, wherein the micropores are formed in the substrate by etching the substrate in a chromic acid bath and wherein said reactant is acetic acid.

13. The process recited in claim 12 including the step of neutralizing the chromic acid on the substrate with a caustic solution prior to treatment with said acetic acid.

14. The process recited in claim 13, including the step of treating the catalyzed substrate with a hydrochloric acid solution prior to electroless plating.

15. The process recited in claim 13, wherein a thin flash electroless deposit is formed over the catalyzed substrate.

* * * * *